United States Patent [19]

Parthasarathi et al.

[11] Patent Number: 4,549,941
[45] Date of Patent: Oct. 29, 1985

[54] ELECTROCHEMICAL SURFACE PREPARATION FOR IMPROVING THE ADHESIVE PROPERTIES OF METALLIC SURFACES

[75] Inventors: Arvind Parthasarathi, Hamden; Ned W. Polan, Madison, both of Conn.

[73] Assignee: Olin Corporation, New Haven, Conn.

[21] Appl. No.: 670,236

[22] Filed: Nov. 13, 1984

[51] Int. Cl.[4] .................. C25D 5/10; C25D 5/34; C25D 5/48; C25D 17/00
[52] U.S. Cl. .................................... 204/27; 204/28; 204/32.1; 204/35.1; 204/40; 204/207
[58] Field of Search .............. 204/15, 27, 28, 32.1, 204/38.1, 37.6, 38.3, 40, 42, 206, 207, 35.1

[56] References Cited

U.S. PATENT DOCUMENTS

| | | | |
|---|---|---|---|
| Re. 30,180 | 12/1979 | Wolski et al. | 428/601 |
| 2,903,403 | 8/1959 | Strauss | 204/32 |
| 3,220,897 | 11/1965 | Conley et al. | 428/606 |
| 3,293,109 | 12/1966 | Luce et al. | 428/556 |
| 3,322,656 | 5/1967 | Dahringer et al. | 204/38 A |
| 3,328,275 | 6/1967 | Waterbury | 204/38 |
| 3,454,376 | 7/1969 | Luce et al. | 204/27 |
| 3,518,168 | 6/1970 | Byler et al. | 204/32 |
| 3,585,010 | 6/1971 | Luce et al. | 204/44 |
| 3,699,018 | 10/1972 | Carlson | 204/27 |
| 3,857,681 | 12/1974 | Yates et al. | 204/27 |
| 3,918,926 | 11/1975 | Wolski et al. | 204/40 |
| 4,049,481 | 9/1977 | Morisaki | 156/151 |
| 4,053,370 | 10/1977 | Yamashita et al. | 204/27 |
| 4,073,699 | 2/1978 | Hutkin | 204/13 |
| 4,088,544 | 5/1978 | Hutkin | 204/12 |
| 4,131,517 | 12/1978 | Mitsuo et al. | 204/27 |
| 4,456,508 | 6/1984 | Torday | 204/27 |
| 4,468,293 | 8/1984 | Polan et al. | 204/27 |

FOREIGN PATENT DOCUMENTS

| | | | |
|---|---|---|---|
| 1371510 | 10/1964 | France | 204/15 |
| 112145 | 3/1975 | German Democratic Rep. | 204/27 |
| 134785 | 3/1979 | German Democratic Rep. | 204/27 |
| 1515361 | 6/1978 | United Kingdom | 204/15 |
| 2030176A | 4/1980 | United Kingdom | 204/27 |

OTHER PUBLICATIONS

Technologien und Spezialausrustungen zur Erzeugung und Nachbehandlung von Kupferfolien by W. Burkhart, *Metall.*, Aug. 1978, pp. 791-793.

*Primary Examiner*—T. M. Tufariello
*Attorney, Agent, or Firm*—Barry L. Kelmachter; Howard M. Cohn; Paul Weinstein

[57] ABSTRACT

The present invention relates to a treatment for improving the adhesive properties of metallic foils to be used in electrical and electronic applications. The treatment of the present invention comprises applying a light substantially uniform layer of metal to at least one surface of the metallic foil just prior to the formation of a plurality of dendritic structures on the surface. The metal layer renders the surface or surfaces to be treated more uniformly electrochemically active and consequently more receptive to the subsequent dendritic treatment. The treatment of the present invention has particular utility in improving the adhesive properties of wrought copper and copper alloy foils. An apparatus for performing the present treatment is also described.

21 Claims, 1 Drawing Figure

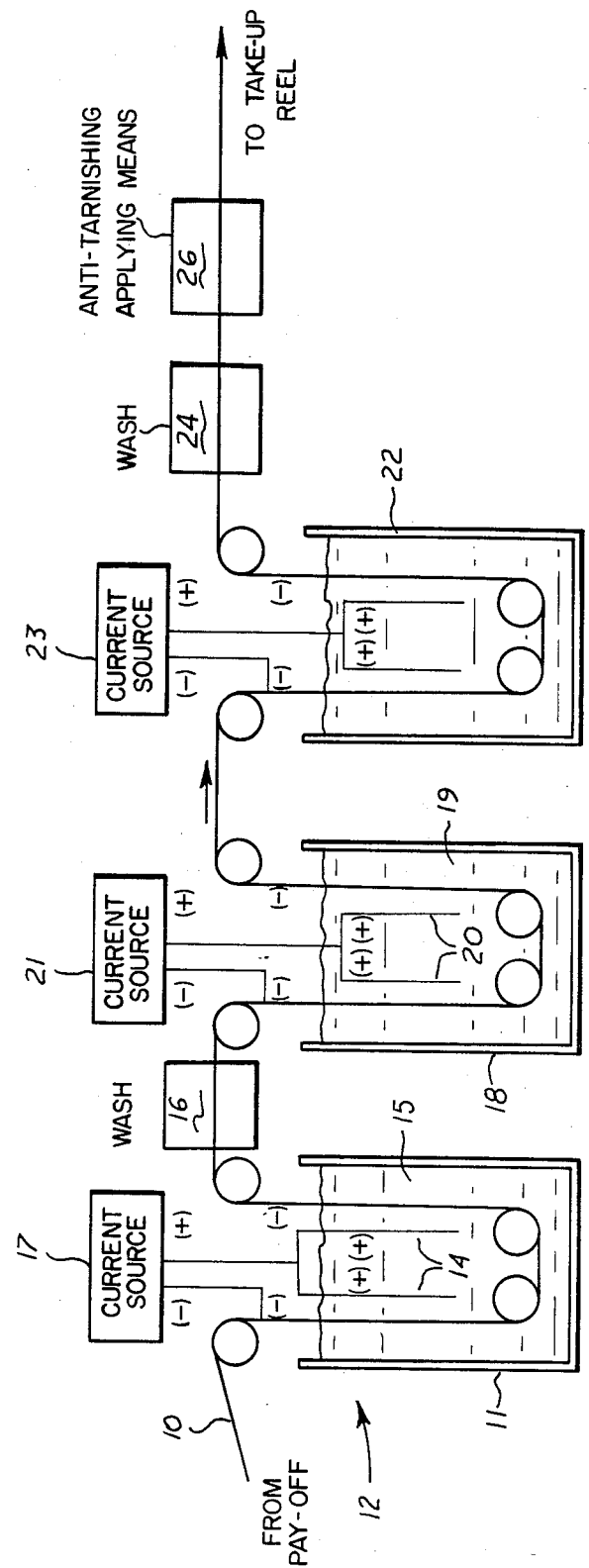

ELECTROCHEMICAL SURFACE PREPARATION FOR IMPROVING THE ADHESIVE PROPERTIES OF METALLIC SURFACES

The present invention relates to a method and apparatus for treating metal sheet, strip or foil to improve its adhesive properties. More particularly, at least one surface of a copper or copper alloy sheet or foil is treated to improve its ability to adhere to a resinous substrate.

In producing printed circuits, it is a common practice to bond metal foil to a substrate material, generally a synthetic polymer, with an adhesive and to subject the composite structure to an acid etching treatment to form the desired circuit. Because the adhesion between the metal foil and the substrate material tends to be weak, considerable effort has been directed toward the development of techniques for increasing the bond strength of the metal foil. As a result of this effort, a variety of treatments have been developed which result in the formation of at least one roughened surface on the metal foil. When the metal foil being used is a copper or copper alloy foil, these treatments generally comprise electrodeposition of a dendritic copper layer on at least one surface of the foil.

In most of these dendritic copper treatments, a nodular powdery copper layer, primarily copper or copper oxide particles, is electrodeposited onto the foil surface. When deposited, these particles form random nodular clusters which increase the surface area of the foil. In some treatments, a second layer called a locking layer is electrodeposited over the nodular layer. This locking layer is non-nodular in nature and generally conforms to the configuration of the dendritic layer. The function of the locking layer is to reduce the powder transfer characteristics of the nodular layer and to maintain the configuration of the surface projections intact during the subsequent circuit fabrication steps such as lamination of the treated material to a substrate. The locking layer may be a layer of copper or copper alloy or a layer of some other metal or metal alloy such as nickel, cobalt, zinc, chromium, and alloys thereof. Illustrative of these prior art treatments are those shown in U.S. Pat. No. 3,220,897 to Conley et al., U.S. Pat. No. 3,293,109 to Luce et al., U.S. Pat. No. 3,322,656 to Dahringer et al., U.S. Pat. No. 3,585,010 to Luce et al., U.S. Pat. No. 3,699,018 to Carlson, U.S. Pat. No. 3,857,681 to Yates et al., U.S. Pat. No. 3,918,926 to Wolski et al., U.S. Pat. No. 4,049,481 to Morisaki, U.S. Pat. No. 4,053,370 to Yamashita et al. and U.S. Pat. No. Re. 30,180 to Wolski et al.

Recently, a technique has been developed for applying a dendritic copper treatment, referred to as a coral copper treatment in the art, to copper or copper alloy foil using a current having regularly recurring pulses. In this technique, copper dendrites are formed on at least one surface of the copper or copper alloy foil during a first portion of each pulse and are bonded to the surface during a second portion of each pulse. It has been discovered that this technique, illustrated in U.S. Pat. No. 4,468,293 to Polan et al., forms well-bonded, dendritic structures that significantly improve the adhesion properties of the treated foil.

One problem in this field that up to now has not been satisfactorily resolved involves the uneven plating of wrought foil by these treatments. After most commercial coral copper treatments, the treated wrought foil exhibits small bare spots, referred to as fish eyes in the industry, or unplated streaks where no dendrites have been deposited. These bare spots or unplated regions become zones of poor adhesion in the finished circuit board - a most undesirable condition, particularly with the current trend towards finer, narrower circuit lines and thinner foil. One approach for overcoming this problem has been suggested in co-pending U.S. Patent Application Ser. No. 670,239, filed on an even date herewith, to Parthasarathi. In this approach, the number of bare spots or unplated regions is reduced by electrolytically forming a copper oxide layer on a copper substrate, reacting the copper oxide with an acid solution to form a layer of copper on the substrate and thereafter applying a dendritic treatment. By forming the copper layer on the surface or sufaces to be treated, the substrate surfaces are rendered more electrochemically active and consequently more receptive to the subsequent dendritic treatment.

In accordance with the present invention, a technique is provided for reducing the number of bare spots or unplated streaks on treated wrought foil. This technique comprises applying a light substantially uniform plating to the surface or surfaces of the metal or metal alloy foil to be treated. The plating is preferably applied after cleaning the foil and just prior to application of a dendritic layer. An apparatus for performing the technique of the present invention is also described.

By plating the metal or metal alloy surface to be treated just prior to the dendritic treatment, the surface or surfaces to be treated are rendered more uniformly chemically active. As a result, the number of unplated zones are significantly reduced. In a preferred embodiment of the present invention, a copper layer or copper strike having a thickness in the range of about 0.01 to 1.0 $\mu$m is substantially uniformly deposited on the surface of the wrought metal or metal alloy foil. The copper strike is preferably electrodeposited from a $CuSO_4$—$H_2SO_4$ solution maintained substantially at room temperature. One advantage to forming the copper strike from a $CuSO_4$—$H_2SO_4$ solution is that the same solution can be used to plate the dendritic structures. This is particularly attractive from an economic standpoint.

It is an object of the present invention to provide a treatment for increasing the adhesive properties of metallic surfaces.

It is a further object of the present invention to provide a treatment as above that reduces the number of bare spots or unplated streaks on the treated metallic surfaces.

It is a further object of the present invention to provide an apparatus for performing the above treatment.

These and other objects and advantages will become more apparent from the following description and drawing in which like reference numerals depict like elements.

The FIGURE is a schematic respresentation of a system for performing the treatment of the present invention.

In accordance with the present invention, a treatment for improving the adhesive properties of wrought metal or metal alloy foils to be used in electrical and electronic applications is provided. The treatment described herein results in increased foil surface dendrite coverage by reducing bare spot or unplated areas to less than about 1% of the total foil surface area. Bare areas which occur on some commercially treated foils cover >10% of the surface, generally taking the form of 2–5 μm wide by 25–200 μm long, shiny, dendrite free stripes.

While the present invention will be discussed in the context of improving the adhesive properties of copper and copper alloy foils, it should be recognized that the treatment of the present invention could be applied to other metal or metal alloy foils. For example, the treatment of the present invention could be used to improve the adhesive properties of foil material formed from nickel or a nickel alloy.

Referring now to the FIGURE, a wrought or as rolled copper or copper alloy sheet, strip or foil 10 is payed off a reel not shown and initially passed through a cleaning station 12 to remove unwanted surface contaminants and degrease the foil. The cleaning station 12 and the cleaning process used therein may comprise any suitable cleaning apparatus and process known in the art. Of course, the particular process and apparatus used to clean and degrease the foil depend to a certain extent upon the compositional nature of the foil 10 to be treated and the type of contaminants to be removed. In a preferred embodiment of the present invention, the copper or copper alloy foil 10 is electrolytically cleaned using an electrochemical cell 11 with the immersed foil being electrically connected as the cathode. The cell 11 may contain one or more anodes 14 and an appropriate electrolyte/cleaning solution 15.

While the cleaning solution 15 may comprise any suitable cleaning solution known in the art, it has been discovered that satisfactory cleaning/degreasing results can be obtained when treating copper or copper alloy foils by using an aqueous $NaOH$—$Na_3PO_4$—$Na_2SiO_3$—$Na_2CO_3$ solution. The cleaning solution may be used at room temperature or at an elevated temperature. For example, a 10.5 g/l $NaOH$, 9.6 g/l $Na_3PO_4$, 40 g/l $Na_2SiO_3$ and 20.9 g/l $Na_2CO_3$ solution at 60° C. may be used to clean the copper or copper alloy foil 10. In lieu of this cleaning solution, satisfactory cleaning/degreasing results may also be obtained using an aqueous 3% $NaOH$ solution. Here too, the solution may be used either at room temperature or at an elevated temperature. In a preferred embodiment, the $NaOH$ solution is also used at a temperature of about 60° C.

After cleaning, the foil 10 should be rinsed and dried to provide a fresh surface for the next step of the process. The foil 10 may be rinsed and dried using any suitable washing and drying technique known in the art. Preferably, the foil is passed through a water rinse 16 and air dried.

As previously mentioned, it has been discovered that the number of bare spots and/or unplated streaks on treated metal foil can be significantly reduced by rendering the surface or surfaces to be treated more uniformly chemically active. To this end, the cleaned/degreased foil 10 is passed through a second electrochemical cell 18. In this cell, a relatively light, substantially uniform layer of metal referred to as a strike is applied to each surface to be treated. The cell 18 may comprise any suitable electrochemical cell known in the art and preferably has at least one anode 20. The anode or anodes 20 in the cell 18 may be formed from any suitable electrically conductive metal or metal alloy. Preferred metals for the anode(s) include lead, lead alloys such as a Pb-6%Sb alloy, platinum and copper. When lead or a lead alloy is used for the anode or anodes, it may be necessary to enclose each anode in a container not shown such as a polypropylene bag to prevent $PbO_2$ particulate from entering the electrolyte solution 19.

The foil 10 immersed in the solution 19 may constitute or may be electrically connected to the cathode.

When the foil 10 being treated is a copper base material and the dendritic treatment to be subsequently applied is a coral copper type treatment, it is preferred to plate a thin layer of copper onto the foil surface or surfaces. It has been discovered that good adhesive and dendritic plating coverage results can be obtained by plating the foil surface(s) with a copper layer having a thickness in the range of about 0.01 to 1.0 μm. In a preferred embodiment, the plated layer has a thickness of from about 0.1 to about 0.5 μm.

While any electrolyte solution containing a concentration of copper ions may be used as the electrolyte solution 19, it is preferred to use an aqueous $CuSO_4$—$H_2SO_4$ solution. When plating the copper layer from a $CuSO_4$—$H_2SO_4$ electrolyte solution, the temperature of the solution may be maintained substantially at room temperature to facilitate ease of use. To obtain satisfactory plating, it is desirable to have the concentration of copper in the solution be high enough to perform the process efficiently yet be below the point at which the copper precipitates out as copper sulfate. At substantially room temperature, the electrolyte solution 19 preferably has a concentration of copper, in the form of copper sulfate, of from about 5 g/l to a saturation concentration of about 60 g/l. Below a copper concentration of 5 g/l, the limiting current becomes too low to reasonably perform the plating process. Above the saturation point, copper sulfate precipitates out and it becomes substantially impossible to get more copper into the solution. In a most preferred embodiment of the present invention, the concentration of copper in the $CuSO_4$—$H_2SO_4$ electrolyte solution maintained substantially at room temperature is in the range of about 10 g/l to about 40 g/l.

Sulfuric acid may be present in the $CuSO_4$—$H_2SO_4$ electrolyte solution in a concentration up to that which causes copper to precipitate out as copper sulfate. Preferably, the sulfuric acid concentration is in the range of about 10 g/l to about 100 g/l for a $CuSO_4$—$H_2SO_4$ solution maintained substantially at room temperature.

While the electrolytic solution may be used at substantially room temperature, it is also possible to plate the copper layer from a $CuSO_4$—$H_2SO_4$ solution maintained at an elevated temperature. The copper and sulfuric acid concentrations discussed above are temperature dependent and may have to be adjusted when the solution is kept at a temperature other than substantially room temperature. At elevated temperatures, the concentration of copper could be proportionately higher since the solubility limit increases with temperature. To use an electrolyte at an elevated temperature, the cell 18 may be provided with any suitable means known in the art (not shown) for maintaining the electrolyte 19 at the desired temperature level.

It has been found that the desired copper plating or strike layer may be formed from the aforementioned $CuSO_4$—$H_2SO_4$ solution by applying a current density in the range of about 5 $mA/cm^2$ to about the limiting current density of the electrolyte solution. Suitable residence or deposition times have been found to be those in the range of at least about 5 sec. up to the time needed to form the maximum thickness of the plating layer at a given current density. Preferably, the plating layer is formed by applying a current density in the range of about 5 $mA/cm^2$ to about 25 $mA/cm^2$ for a time in the range of about 5 sec. to about 2 minutes. Any suitable conventional current source 21 may be used to apply the desired current densities. Maintaining the electrolyte solution at an elevated temperature, allows the plating of the copper strike layer at a faster speed by using a higher current density.

Immediately after the copper strike layer has been applied, the foil 10 is subjected to a dendritic deposition treatment. This is done to take advantage of the increased electrochemically active nature of the foil surface or surfaces. Although not necessary, the foil 10 may be subjected to a washing operation between the plating and dendritic treatment steps if desired. When the same electrolyte solution is to be used for the subsequent dendritic deposition treatment, the washing step should be omitted. The ommision of the intermediate washing step provides an economic advantage in that there is one less step to perform. It also permits avoidance of a potential waste disposal problem. Any suitable dendritic treatment using any suitable apparatus known in the art such as electrochemical cell 22 and current source 23 be used to form the dendrites on the foil surface. When the foil 10 is formed from a copper base material, it is preferred to deposit copper dendrites from a $CuSO_4$—$H_2SO_4$ solution onto the foil surface(s). A preferred technique for forming the dendrites and bonding them to the foil surface(s) is described in U.S. Pat. No. 4,468,293 to Polan et al., which is hereby incorporated by reference.

When the copper strike layer and the dendritic treatment are sequentially applied in a production line using the same electrolyte solutions, it may be necessary to increase the amount of copper being plated in tank 18 for a given period of time in order to maintain a constant line speed. To be able to plate the copper faster without forming dendrites on the foil 10 at the current densities being applied, the solution 19 in the tank 18 is preferably kept at a higher temperature than the electrolytic solution in the tank 22. For example, the solution 19 may be kept at a temperature in the range of slightly above room temperature to about the solution boiling temperature while the solution in tank 22 is kept at a temperature in the range of about room temperature to about 60° C. In a preferred production line embodiment, the solution 19 is kept at a temperature in the range of about 40° C. to about 60° C. while the solution in tank 22 is kept at a temperature in the range of about room temperature to about 40° C.

After application of the dendritic treatment, the treated foil 10 may be subjected to a washing operation to remove unwanted chemicals from the treated surface(s). Any suitable means 24 known in the art such as a water rinse may be used to rinse the treated foil. After rinsing, the foil 10 may be dried using any suitable drying means (not shown) known in the art. If desired, the treated foil may be subjected to an anti-tarnishing treatment. Any suitable anti-tarnishing treatment applied by any suitable means 26 known in the art may be used. For example, the treated foil 10 may be immersed in a chromic acid solution.

It has been found that by plating the surface of the foil 10 immediately prior to the dendritic treatment, bare areas and/or unplated streaks on the treated foil may be reduced to less than 1% of the total foil surface area. The adhesive properties of the treated foil are noticeably improved by this decrease in the percentage of bare areas and/or unplated streaks. As a result, stronger bonds can be formed when the treated foil is laminated to a substrate material such as a resinous substrate.

To demonstrate the present invention, the following example was performed.

EXAMPLE

A strip of copper alloy C11000 in an as rolled condition was first cleaned in an aqueous 3% NaOH solution at 60° C. After cleaning and rinsing, a copper strike layer having a thickness of 0.2 $\mu$m was deposited from an electrolyte containing 20 g/l Cu and 45 g/l $H_2SO_4$ using a current density of 10 mA/cm.$^2$ and a deposition time of 60 sec. The plating treatment was performed in an electrochemical cell having a Pb-6%Sb anode and the foil as the cathode. After plating, a uniform substantially defect-free dendritic layer having of thickness of about 1.0 $\mu$m was formed using the same electrolyte and the same cell as used in the plating step. During the dendritic treatment, a current density of 100 mA/cm.$^2$ was applied for a time of about 8 seconds.

The foil treated in accordance with the above technique exhibited bare areas over less than 1% of the total foil surface area. In comparison, a commercially treated foil exhibits bare areas over more than 10% of the total foil surface area. The bare areas on this commercially treated foil generally take the form of 2-5 $\mu$m wide by 25-300 $\mu$m long, shiny, dendrite free stripes.

While the plating treatment and the dendritic treatment have been illustrated as being performed in different electrochemical cells, they may be performed in the same electrochemical cell if so desired.

While the invention has been described in the context of treating one surface of the foil 10, it is possible to treat a plurality of foil surfaces if so desired. When treating more than one surface, however, the various electrochemical cells may have to be provided with a plurality of anodes on more than one side of the foil.

Any suitable means known in the art such as rollers may be used to pass the foil through the electrochemical cells 11, 18 and 22.

As previously mentioned, the technique of the present invention has greater applicability than just treating copper and copper alloy foils. When applying the present invention to metal or metal alloy materials other than copper or copper alloy materials, the various operational parameters such as the composition of the electrolyte solutions, the concentrations of the metal or metals in the electrolyte solutions, the temperatures of the electrolyte solutions, the applied current densities and the deposition or residence times may have to be adjusted accordingly.

The U.S. patents and patent application set forth in this specification are intended to be incorporated by reference herein.

It is apparent that there has been provided in accordance with this invention an electrochemical surface preparation for improving the adhesive bonding properties of metallic surfaces which fully satisfies the objects, means and advantages set forth hereinbefore. While the invention has been described in combination with specific embodiments thereof, it is evident that many alternatives, modifications and variations will be apparent to those skilled in the art in light of the foregoing description. Accordingly, it is intended to cover all such alternatives, modifications, and variations as fall within the spirit and broad scope of the appended claims.

What is claimed:

1. A method for improving the adhesive properties of a metallic material in a wrought condition, said method comprising:

forming a plurality of copper or copper oxide dendritic structures on at least one surface of said wrought metallic material, wherein the improvement comprises:

plating a layer of copper onto said at least one surface just prior to said dendritic structure forming step to render said at least one surface more uniformly electrochemically active and to thereby reduce the number of unplated regions on said at least one surface.

2. The method of claim 1 further comprising:

cleaning said at least one surface prior to said plating step to remove surface contaminants from and to degrease said metallic material.

3. The method of claim 2 further comprising:

rinsing said at least one surface after said cleaning step.

4. The method of claim 1 further comprising:

applying an anti-tarnishing composition to said metallic material after said dendritic structure forming step.

5. The method of claim 2 further comprising:

providing a copper base material in wrought form; and said plating step comprising electrolytically forming said copper layer, said copper layer having a thickness in the range of about 0.01 to about 1.0 $\mu$m.

6. The method of claim 5 wherein said electrolytic forming step comprises:

providing an electrochemical cell containing a $CuSO_4$—$H_2SO_4$ electrolyte solution;

immersing said copper base material into said electrolyte solution; and applying a current density in the range of about 5 $mA/cm.^2$ to about the limiting current density of said solution for at least about 5 seconds.

7. The method of claim 6 wherein:

said immersing step comprises immersing said copper base material in an aqueous solution substantially at room temperature containing a copper concentration of about 5 g/l to about 60 g/l and a sulfuric acid concentration of about 10 g/l to about 100 g/l; and said current density applying step comprises applying a current density in the range of about 5 $mA/cm.^2$ to about 25 $mA/cm.^2$ for a time in the range of about 5 seconds to about 2 minutes.

8. The method of claim 5 wherein:

said dendritic forming step comprises electrolytically forming a layer of nodular copper or copper oxide particles on said at least one surface and bonding said particles thereto.

9. The method of claim 5 wherein said cleaning step comprises:

providing an electrochemical cell containing an aqueous 3% NaOH electrolyte solution; and immersing said copper base material in said electrolyte solution; and applying a current to said cell to electrolytically clean said copper base material.

10. The method of claim 5 wherein said cleaning step comprises:

providing an electrochemical cell containing an aqueous electrolyte solution formed by a mixture of NaOH, $Na_3PO_4$, $Na_2SiO_3$ and $Na_2CO_3$;

immersing said copper base material in said electrolyte solution; and applying a current to said cell to electrolytically clean said copper base material.

11. A metal or metal alloy foil having improved adhesive properties, said foil being produced in accordance with the method of claim 1.

12. A copper or copper alloy foil having improved adhesive properties, said foil being produced in accordance with the method of claim 5.

13. An apparatus for treating a wrought metallic material to improve its adhesive properties, said apparatus comprising:

means for forming a plurality of dendritic structures on at least one surface of said wrought metallic material, wherein the improvement comprises:

means for electrolytically forming a layer of metal onto said at least one surface just prior to said dendritic structures being formed on said at least one surface;

said metal layer forming means comprising a tank containing an acidic electrolyte solution, at least one anode immnersed in said solution and means for rendering said metallic material cathodic as it passes through said solution; and said metal layer rendering said at least one surface more uniformly electrochemically active and reducing the number of unplated zones on said at least one surface.

14. The apparatus of claim 13 further comprising:

means for cleaning said at least one surface prior to forming said metal layer on said at least one surface.

15. The apparatus of claim 14 further comprising:

means for rinsing said at least one surface after said cleaning.

16. The apparatus of claim 13 further comprising:

means for applying an anti-tarnishing treatment to said metallic material after said dendritic structures have been formed.

17. The apparatus of claim 13 wherein said forming means comprises means for electrolytically forming a layer of copper onto said at least one surface.

18. The apparatus of claim 17 wherein:

said electrolyte solution comprises a $CuSO_4$—$H_2SO_4$ solution.

19. The apparatus of claim 14 wherein said cleaning means comprises means for electrolytically cleaning said at least one surface.

20. The apparatus of claim 13 wherein said dendritic structure forming means comprises means for electrolytically forming nodular copper or copper oxide particles on and bonding said particles to said at least one surface.

21. A method for improving the adhesive properties of a metallic material, said method comprising:

plating a layer of metal onto at least one surface of said metallic material, said plating step comprising immersing said metallic material in a first electrolyte solution and applying a cathodic current to said metallic material;

forming a plurality of dendritic structures on said at least one surface after said plating step, said dendritic structure forming step comprising immersing said foil in a second electrolyte solution having substantially the same composition as said first solution and being maintained at a lower temperature than said first solution;
said dendritic forming step further comprising applying a cathodic current to said foil; and
said plating step being performed just prior to said dendritic forming step and serving to render said at least one surface more uniformly electrochemically active, thereby reducing the number of unplated regions on said at least one surface.

* * * * *